(12) United States Patent
Jia et al.

(10) Patent No.: US 11,323,180 B2
(45) Date of Patent: *May 3, 2022

(54) SYSTEM AND METHODS FOR EFFICIENT DIGITIZATION IN A COMMUNICATION NETWORK

(71) Applicant: CABLE TELEVISION LABORATORIES, INC, Louisville, CO (US)

(72) Inventors: Zhensheng Jia, Superior, CO (US); Luis Alberto Campos, Superior, CO (US); Curtis Dean Knittle, Superior, CO (US); Jing Wang, Broomfield, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,009

(22) Filed: Aug. 31, 2020

(65) Prior Publication Data

US 2020/0396004 A1 Dec. 17, 2020

Related U.S. Application Data

(63) Continuation of application No. 15/847,417, filed on Dec. 19, 2017, now Pat. No. 10,763,963.

(60) Provisional application No. 62/435,961, filed on Dec. 19, 2016.

(51) Int. Cl.
*H04B 10/69* (2013.01)
*H04B 10/2507* (2013.01)
*H04B 10/54* (2013.01)
*H03M 3/00* (2006.01)

(52) U.S. Cl.
CPC ....... *H04B 10/2507* (2013.01); *H04B 10/541* (2013.01); *H04B 10/697* (2013.01); *H03M 3/424* (2013.01); *H03M 3/43* (2013.01)

(58) Field of Classification Search
CPC .............. H04B 10/2507; H04B 10/541; H04B 10/697; H03M 3/43; H03M 3/424
See application file for complete search history.

(56) References Cited

U.S. PATENT DOCUMENTS

| | | | |
|---|---|---|---|
| 10,763,963 B2* | 9/2020 | Jia | H04B 10/697 |
| 2006/0119493 A1* | 6/2006 | Tal | H03M 7/3017 341/143 |
| 2006/0203922 A1* | 9/2006 | Rezeq | H03M 7/3022 375/247 |

* cited by examiner

*Primary Examiner* — Kenneth T Lam
(74) *Attorney, Agent, or Firm* — Armstrong Teasdale LLP

(57) ABSTRACT

An analog signal processor includes a sampling unit configured to (i) filter, in the frequency domain, a received time domain analog signal into a low-frequency end of a corresponding frequency spectrum, (ii) sample the filtered analog signal at a frequency substantially higher than the low-frequency end, and (iii) spread quantization noise over an expanded Nyquist zone of the corresponding frequency spectrum. The processor further includes a noise shaping unit configured to shape the spread quantization noise out of the low-frequency end of the corresponding frequency spectrum such that the filtered analog signal and the shaped quantization noise are substantially separated in the frequency domain, and a quantization unit configured to apply delta-sigma modulation to the filtered analog signal using at least one quantization bit, and output a digitized bit stream that substantially follows the amplitude of the received time domain analog signal.

7 Claims, 7 Drawing Sheets

SYSTEM AND METHODS FOR EFFICIENT DIGITIZATION IN A COMMUNICATION NETWORK

CROSS REFERENCE TO RELATED APPLICATIONS

This application is a continuation of U.S. patent application Ser. No. 15/847,417, filed Dec. 19, 2017, which application claims the benefit of and priority to U.S. Provisional Patent Application Ser. No. 62/435,961, filed Dec. 19, 2016, which is incorporated herein by reference in its entirety.

BACKGROUND

The field of the disclosure relates generally to fiber communication networks, and more particularly, to digitization techniques in hybrid fiber coaxial networks.

Typical hybrid fiber-coaxial (HFC) architectures deploy few long fiber strands from fiber a hub to a node, but often many short fiber strands are deployed to cover the shorter distances that are typical from legacy HFC nodes to end users. Conventional Multiple Service Operators (MSOs) offer a variety of services, including analog/digital TV, video on demand (VoD), telephony, and high speed data internet, over HFC networks that utilize both optical fibers and coaxial cables.

FIG. 1 is a schematic illustration of a conventional HFC network 100 operable to provide video, voice, and data services to subscribers. HFC network 100 includes a master headend 102, a hub 104, a fiber node 106, and end users/subscribers 108. An optical fiber 110 carries optical analog signals and connects the link between master headend 102, hub 104, and fiber node 106. A plurality of coaxial cables 112 carry radio frequency (RF) modulated analog electrical signals and connect fiber node 106 to respective end users 108.

In operation, fiber node 106 converts the optical analog signals from optical fiber 110 into the RF modulated electrical signals, which are then transported along coaxial cables 112 to end users/subscribers 108. In some instances, HFC network 100 implements a fiber deep architecture. HFC network 100 may further utilize electrical amplifiers 114 respectively disposed along coaxial cables 112 to amplify the RF analog signals to respective end users 108. In HFC network 100, both the optical and electrical signals are in the analog form from hub 104 all the way to the subscriber's home of end user 108. Typically, a cable modem termination system (CMTS) is located at either headend 102 or hub 104, and provides complementary functionality to cable modems (CMs) (not shown) respectively disposed at end users 108.

Recently, the Data Over Cable Service Interface Specification (DOCSIS) has been established as an international standard interface that permits the addition of high-bandwidth Internet protocol (IP) data transfer to an existing HFC network, such as HFC network 100. The latest DOCSIS standard, DOCSIS 3.1, offers (1) the opportunity to expand transmitted spectrum beyond the bandwidths that had previously been available, and in both the downstream and upstream directions, and (2) more efficient use of the spectrum itself. However, a DOCSIS 3.1 HFC network (i.e., supporting orthogonal frequency division multiplexing (OFDM), when compared with its previous DOCSIS HFC network)), requires significantly higher system performance for both the upstream and the downstream signals, and particularly with respect to the carrier to noise ratio (CNR) or the modulation error ratio (MER).

The DOCSIS 3.1 Physical Layer Specification defines the downstream minimum required CNR performance of OFDM signals with low-density parity-check (LDPC) error correction in additive white Gaussian noise (AWGN) channel as shown in Table 1, below. For example, a typical OFDM quadrature amplitude modulation (QAM) of 1024 (1K-QAM) requires a signal performance of 34 dB CNR, or approximately 41-41.5 decibels (dB) CNR for the 4K-QAM modulation format option in the downstream direction. A similar situation occurs in the DOCSIS 3.1 upstream transmission path, as shown in Table 2, also below.

In such analog HFC systems, the quality of the recovered RF signal channel (e.g., at CMs of end users 108) is determined according to the carrier-to-composite noise (CCN), or CCN ratio. The CCN of an HFC fiber link represents the combination of noise components (e.g., shot noise, thermal noise, laser noise (i.e., from hub/headend laser transmission), etc.), the intermodulation noise (e.g., second, third, and higher order components), and the crosstalk noise (e.g., nonlinear fiber interactions, such as four-wave mixing, cross-phase modulation, Raman crosstalk, etc.). Continuous envelope and high peak-to-average power ratio (PAPR) are significant concerns with respect to OFDM signals in particular. That is, OFDM signals are very sensitive to nonlinear intermodulation, especially composite triple beat (CTB). Second-order nonlinear products are out-of-band and are typically filtered. However, most third-order nonlinear products are located in-band, and cause problems by overlapping with existing carriers.

TABLE 1

CM minimum CNR performance in AWGN channel

| Constellation (QAM) | CNR (dB) up to 1 GHz | CNR (dB) up to 1.0-1.218 GHz |
|---|---|---|
| 4096 | 41 | 41.5 |
| 2048 | 37.0 | 37.5 |
| 1024 | 34.0 | 34.0 |
| 512 | 30.5 | 30.5 |
| 256 | 27.0 | 27.0 |
| 128 | 24.0 | 24.0 |
| 64 | 21.0 | 21.0 |
| 16 | 15.0 | 15.0 |

TABLE 2

CMTS minimum CNR performance in AWGN channel

| Constellation (QAM) | CNR (dB) |
|---|---|
| 4096 | 43.0 |
| 2048 | 39.0 |
| 1024 | 35.5 |
| 512 | 32.5 |
| 256 | 29.0 |
| 128 | 26.0 |
| 64 | 23.0 |
| 32 | 20.0 |
| 16 | 17.0 |
| 8 | 14.0 |
| QPSK | 11.0 |

Accordingly, the link loss and the analog linear distortions significantly limit the achievable link budget of the conventional HFC network. The effect on the achievable link budget is even more pronounced with respect to high-order modulation formats, which target a high data rate. Conventional analog optics technology is unable to keep up with the increasing data demand on legacy HFC networks. Replacing such legacy HFC networks, however, would be very expensive, and thus impractical.

BRIEF SUMMARY

In an embodiment, an analog signal processor includes a sampling unit configured to (i) filter, in the frequency domain, a received time domain analog signal into a low-frequency end of a corresponding frequency spectrum, (ii) sample the filtered analog signal at a frequency substantially higher than the low-frequency end, and (iii) spread quantization noise over an expanded Nyquist zone of the corresponding frequency spectrum. The processor further includes a noise shaping unit configured to shape the spread quantization noise out of the low-frequency end of the corresponding frequency spectrum such that the filtered analog signal and the shaped quantization noise are substantially separated in the frequency domain, and a quantization unit configured to apply delta-sigma modulation to the filtered analog signal using at least one quantization bit and output a digitized bit stream that substantially follows the amplitude of the received time domain analog signal.

In an embodiment, a hybrid fiber coaxial (HFC) network is provided. The network includes an optical hub configured to transmit a digitized bit stream over a digital optical link, a fiber node configured to receive the digitized bit stream over the digital optical link and convert the received digitized bit stream into a delta-sigma demodulated analog signal, and at least one end user configured to receive the delta-sigma demodulated analog signal from the fiber node.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
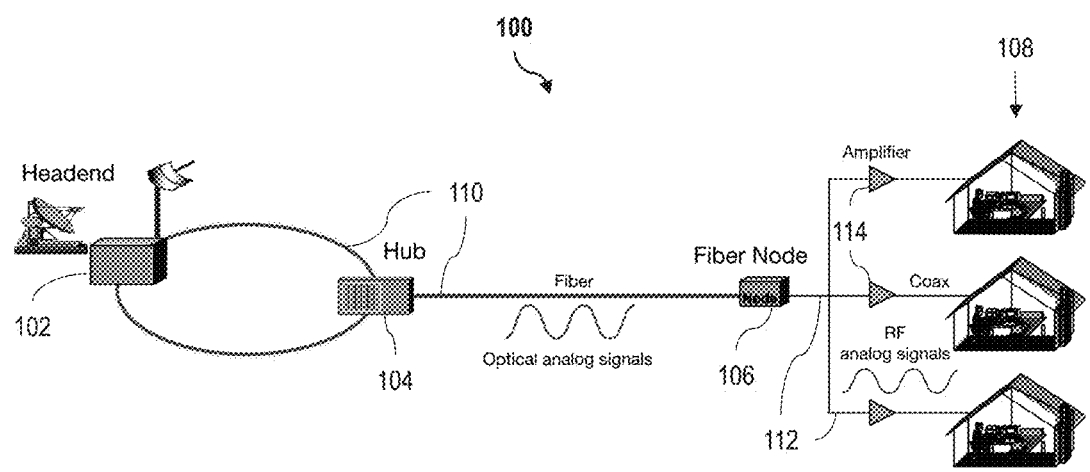
FIG. 1 is a schematic illustration of a conventional HFC network.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

According to the embodiments described herein, a digital optical network implements a digital optical link over a digitized distributed network, or utilizing a digitized analog signal over the conventional HFC network. The digital optical network according to the present systems and methods is less affected by link loss, and also realizes a higher tolerance to nonlinear noise from the laser (e.g., of the headend/hub) or the fiber itself when the optical power is above the sensitivity of the receiver (e.g., of an end user). The present digital optical network is therefore advantageously able to realize transmission over longer distances, support wavelengths per fiber, and effectively eliminate optical noise contribution to CNR. Moreover, according to the advantageous techniques described herein, the CMTS and respective CMs may operate at higher orders of modulation format.

In the exemplary embodiments, optical digital transmission is accomplished utilizing delta-sigma modulation and demodulation. Key steps in the optical digital transmission process include analog-to-digital (A/D) and digital-to-analog (D/A) conversion. The A/D conversion (ADC) and D/A conversion (DAC) subprocesses involve two important factors: (1) sampling rate; and (2) bit resolution. The minimum sampling rate is generally governed according to the Nyquist Sampling Theorem, whereas the bit resolution it important for determining the quantization noise. In some of the embodiments described below, a DOCSIS digitization scheme, utilizing delta-sigma modulation and demodulation, is applied to variations of a conventional HFC network and implements one or more of (i) oversampling, (ii) decimation filtering, and (iii) quantization noise shaping, to achieve ultra-high resolution and excellent antialiasing filtering. The present embodiments are therefore of particular advantageous use in audio applications, precision temperature measurements, and weighing scales.

The present systems and methods are further capable of implementing low-pass filtering that does not demand the processing latency experienced in conventional HFC networks. Furthermore, the present optical digital transmission systems and networks realize even lower latencies than those experienced utilizing conventional ADC/DAC approaches. Low latency is a particularly critical factor in virtual reality and immersive applications that networks of the future will have to support. By leveraging frequency selective digitization, the present embodiments are even further able to advantageously reduce the amount of data required to represent the analog spectrum, such as the analog cable signal of HFC network 100, FIG. 1, above.

Figure 2A:
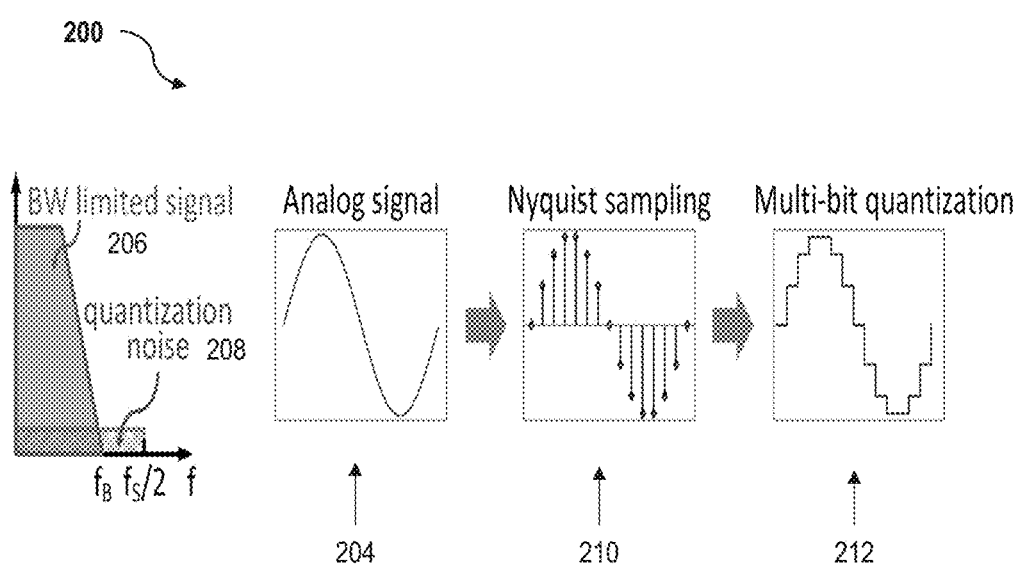
FIGS. 2A-2B are graphical illustrations depicting respective operating principles of a conventional sampling process 200 compared with an exemplary modulation process.
Figure 2B:
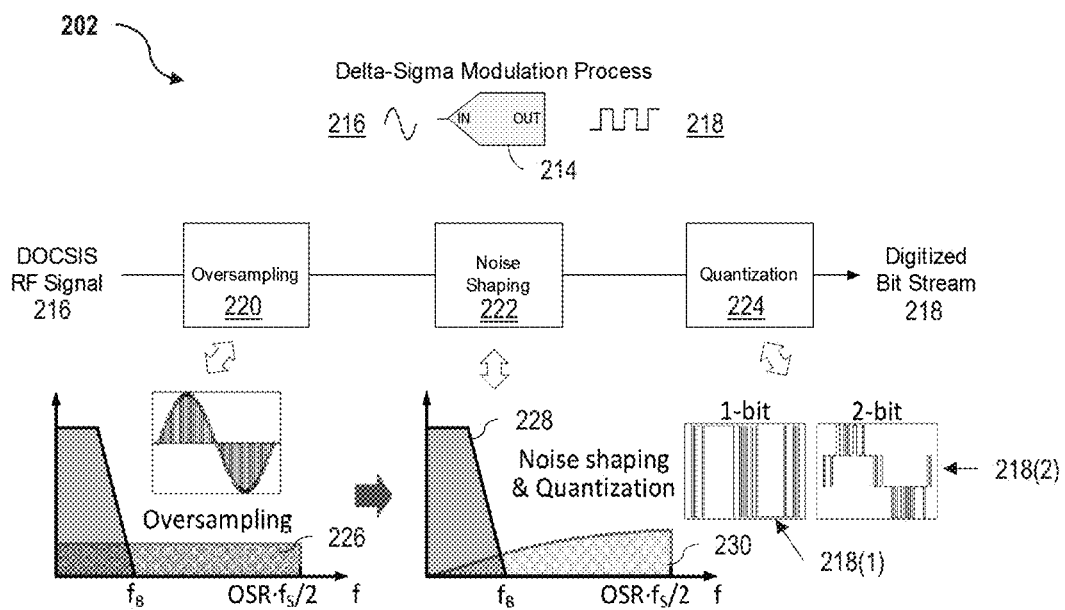

FIGS. 2A-2B are graphical illustrations depicting respective operating principles of a conventional sampling process 200 compared with an exemplary modulation process 202, according to an embodiment. Process 200 depicts the operation of a conventional Nyquist-Shannon sampling ADC for an analog signal 204 (shown the time domain). In the exemplary embodiment, process 200 bandwidth-limits analog signal 204 in the corresponding frequency domain (e.g., using a low-pass filter 206, at frequency $f_B$). In the example shown in FIG. 2A, quantization noise 208 is uncorrelated with the frequency of the input signal, and is spread evenly over the Nyquist bandwidth $f_S/2$. Process 200 performs Nyquist sampling 210 of analog signal 204 (i.e., at the Nyquist frequency), and quantizes each sample by multiple quantization bits to produce multi-bit quantization signal 212.

Since the quantization noise of a Nyquist ADC is approximately Gaussian, as well as uniformly spread over the Nyquist zone, a very large number of quantization bits are needed to ensure the signal-to-noise ratio (SNR) (e.g., CNR or MER) of the resulting digitized signals 212. Such a large number of required quantization bits leads to very high requirements for the effective number of bits (ENOB), while also producing a low spectral efficiency and a data rate bottleneck. That is, according to the prior art techniques, a narrow band analog signal can consume tremendous transmission bandwidth after digitization, due to the large number of quantization bits for each sample.

These drawbacks of conventional sampling techniques are solved according to exemplary modulation process 202. As depicted in FIG. 2B, in exemplary modulation process 202, a processor 214 of an A/D converter (not shown in FIG. 2B) applies delta-sigma modulation to exploit an oversampling ADC that utilizes one or two quantization bits on an input signal 216 to generate an output signal 218. In some embodiments, output signal 218 is binary (e.g., one-bit quantization). In other embodiments, output signal 218 is a PAM4 output signal (e.g., two-bit quantization).

More particularly, modulation process 202 implements an oversampling subprocess 220, a noise shaping subprocess 222, and a quantization subprocess 224. In oversampling subprocess 220, modulation process 202 samples analog input signal 216 (e.g., a DOCSIS RF signal) at a high frequency, and spreads the quantization noise over an expanded Nyquist zone 226. Modulation process 202 then implements noise shaping subprocess 222 to push the quantization noise out of the signal band. In the example depicted in FIG. 2B, a low-pass delta-sigma modulator 228 places analog signal 216 in the low-frequency end of the spectrum, and a noise transfer function 230 functions as a high-pass filter to push the quantization noise out of the signal band to the high frequency end, such that analog signal 216 is separated from the noise in the frequency domain. The delta-sigma modulation technique of modulation process 202 outputs binary (e.g., on/off key (OOK)) signal 218 (1) or non-binary signal 218 (2) (e.g., PAM4 (pulse-amplitude-modulation having four amplitude levels)), depending on one-bit or two-bit quantization, and having a baud rate equal to the oversampling ADC of the subprocess 220. Accordingly, the resulting output binary or non-binary signal 218 generally follows the amplitude of analog input signal 216 in an average sense.

According to the advantageous technique of modulation process 202, the output produced using the present delta-sigma modulation techniques represents a high data rate bit stream (e.g., output 218), having an amplitude that generally tracks with the amplitude of the input analog signal (e.g., input signal 216) after a weighted moving average, for example. In the exemplary embodiment, an averaging process implements low-pass filtering, and is thereby capable of smoothing out the high frequency oscillation of the output digitized bit stream. The use of low-pass filtering further advantageously allows for easier and more reliable retrieval, i.e., modulation, of the original analog signal from the output digitized bit stream, as described below with respect to FIG. 3.

Figure 3:
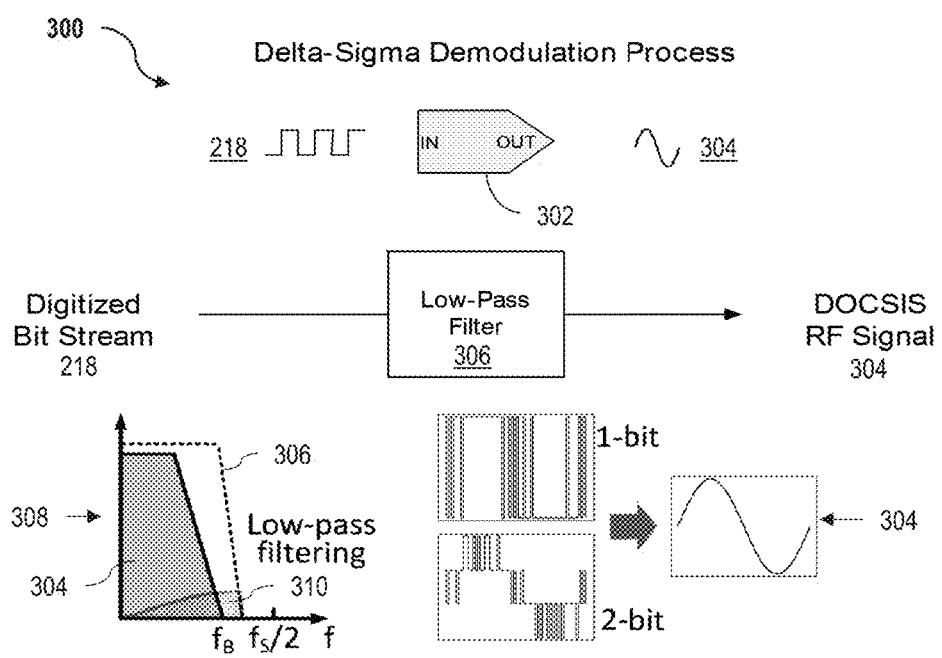
FIG. 3 is a graphical illustration depicting an operating principle of a demodulation process for the modulated digitized output signal depicted in FIG. 2B, according to an embodiment.

FIG. 3 is a graphical illustration depicting an operating principle of a demodulation process 300 for the modulated digitized output signal 218, FIG. 2B, above. More specifically, in demodulation process 300, a processor 302 implements delta-sigma demodulation to retrieve an analog signal 304 from digitized bit stream 218, FIG. 2B, using a low-pass filter 306. This advantageous technique is significantly simpler in comparison to the conventional Nyquist DAC, which reads the quantization bits of each sample, and converts the read quantization bits to an appropriate output level. A frequency domain diagram 308 illustrates the advantages of the present delta-sigma operating principle, in the frequency domain, over the more laborious conventional Nyquist demodulation techniques. That is, low-pass filter 306 effectively eliminates the out-of-band noise and filters retrieved analog signal 304 at the low frequency end. In this example, as illustrated in FIG. 3, retrieved analog signal 304 has an uneven noise floor 310 due to noise shaping.

Figure 4A:
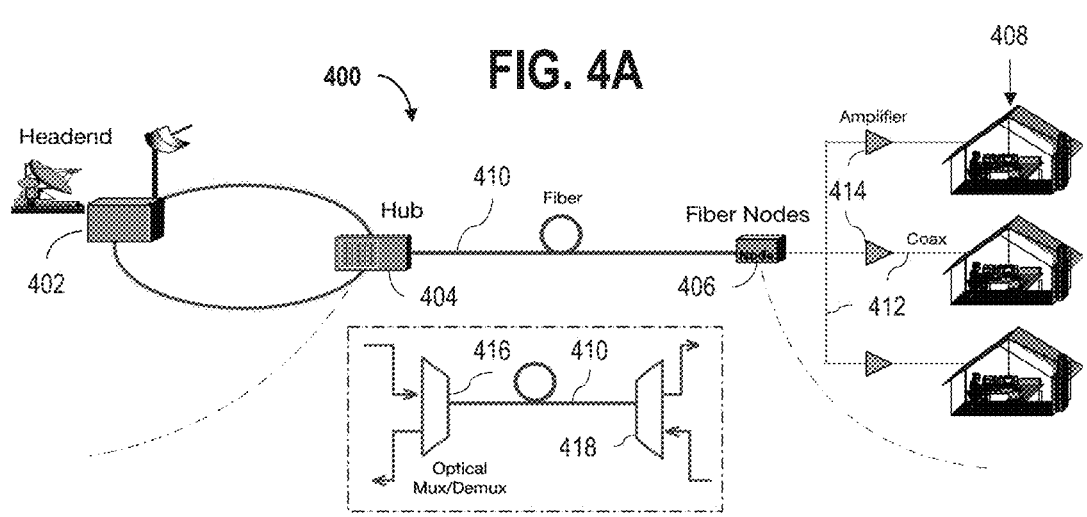
FIGS. 4A-B are schematic illustrations of an exemplary HFC network utilizing the delta-sigma modulation process depicted in FIG. 2B, and the delta-sigma demodulation process depicted in FIG. 3.
Figure 4B:
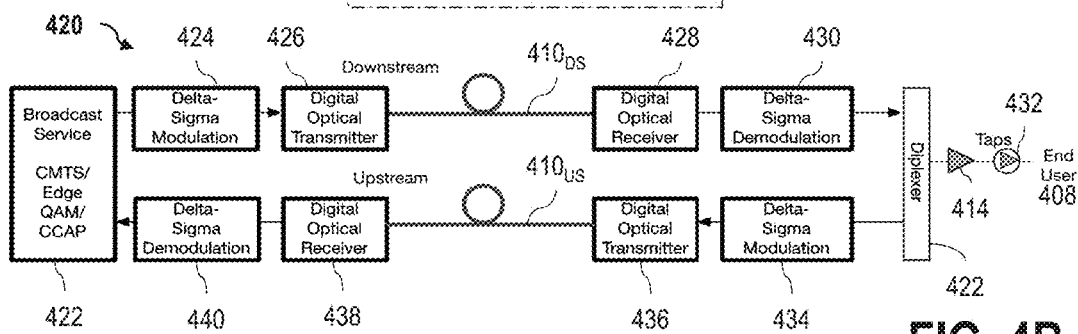

FIGS. 4A-B are schematic illustrations of an exemplary digitized HFC network 400 utilizing modulation process 202, FIG. 2B, and demodulation process 300, FIG. 3. Digitized HFC network 400 is similar to HFC network 100 in overall structure, except that digitized HFC network 400 is configured to implement delta-sigma modulation and demodulation instead of the conventional A/D and D/A conversion techniques. Specifically, HFC network 400 includes a headend 402, a hub 404, a fiber node 406, end users/subscribers 408, and at least one optical fiber 410 connecting the link between headend 402, hub 404, and fiber node 406. Optical fiber 410 is also configured to carry digitized bit streams of the downstream and/or upstream optical signals. A plurality of coaxial cables 412 connect fiber node 406 to respective end users 408, and carry the analog electrical signals therebetween. Digitized HFC network 400 optionally implements amplifiers 414 along coaxial cables 412.

In some embodiments, both of the digitized upstream and downstream optical signals are transmitted along the same optical fiber 410. In such instances, hub 404 includes an optical multiplexer/demultiplexer 416 for respectively combining/splitting the downstream and upstream optical signals, and fiber node 406 similarly includes an optical multiplexer/demultiplexer 418. Multiplexers/demultiplexers 416, 418 may be passive devices, such as diplexers, or active configuration units. In other embodiments, the upstream and downstream signals are transmitted along separate fibers, and multiplexing is optional (e.g., where multiple optical signals are transmitted in the same direction).

FIG. 4B illustrates an exemplary architecture 420 for implementing the delta-sigma modulation and demodulation processes of digitized HFC network 400. In operation of architecture 420, a downstream analog signal (e.g., analog signal 216, FIG. 2B) from a CMTS 422 of headend 402/hub 404 is converted into a digital signal by a downstream delta-sigma modulator 424 (e.g., using modulation process 202, FIG. 2B) for analog signal digitization. In the exemplary embodiment, the downstream analog signal is an analog DOCSIS RF signal from a broadcast service of CMTS 422, or may constitute edge QAM technology or a converged cable access platform (CCAP). A bit stream (e.g., output 218, FIG. 2B) generated by downstream modulator 424 drives a downstream digital optical transmitter 426 to transmit the downstream digitized bit stream over optical fiber 410 to be received by a downstream digital optical receiver 428 of fiber node 406.

At fiber node 406, an upstream delta-sigma demodulator 430 converts (e.g., by demodulation process 300, FIG. 3) the downstream electrical digital bit stream from downstream delta-sigma modulator 424 back into analog form, where this demodulated downstream analog signal may be further transmitted throughout an existing HFC cable infrastructure, such as over coaxial cables 412, amplifiers 414, and optional taps 432.

In further operation of digitized HFC network 400, upstream transmissions are accomplished similarly to the downstream transmissions, but in reverse. That is, fiber node 406 receives an analog RF signal from one or more end users 408. An upstream delta-sigma modulator 434 converts the upstream analog signal into a digital upstream bit stream, which drives an upstream digital optical transmitter 436 of fiber node 406 to transmit the upstream digitized bit stream over optical fiber 410, to be received by an upstream digital optical receiver 438 of hub 404. An upstream delta-sigma demodulator 440 converts the upstream electrical digital bit stream into analog form, which may then be received by CMTS 422.

As described above, for upstream transmissions, a different optical wavelength from the downstream transmission may be used. Alternatively, the downstream and upstream digitized bit streams may be separately transmitted over separate optical fibers $410_{DS}$ and $410_{US}$, respectively. In the alternative embodiments, an electrical diplexer 442 and or optical multiplexers/demultiplexers (e.g., elements 416, 418, FIG. 4A) may be utilized where node aggregation and/or node splitting is desired. The present embodiments are therefore of particular advantage to fiber-starved network environments faced by many present-day cable operators, where more limited conventional node aggregation and splitting techniques are commonly implemented to maximize fiber utilization.

By rendering the delta-sigma modulation and demodulation processes complementary (or the same) in both the downstream and upstream directions, the present techniques may be further advantageously deployed within existing legacy HFC networks, and without requiring significant hardware modifications to the CMTS in the headend/hub, or to the existing infrastructure between the fiber node and end users (i.e., electrical amplifiers, taps, etc.). In the exemplary embodiment illustrated in FIGS. 4A-4B, the optical connection between the hub and the fiber node is upgraded to a digital optical link. Through this digital optical link, digitized HFC network 400 is therefore advantageously capable of utilizing several different optical transport technologies, such as direct optical detection or coherent optical detection, depending on the requirement of oversampling rate and SNR for the various transmission conditions (e.g., legacy fiber, distance, etc.) and resulting link capacity. Through these advantageous techniques, the present systems and methods are thus able to achieve significantly longer transmission distances through use of the high-performance, delta-sigma modulation-based digital transmission.

At present, transport in the cable environment is asymmetric. Accordingly, the requirements for HFC systems that implement the present delta-sigma modulation techniques may also be applied asymmetrically. According to the delta-sigma modulation techniques described herein though, only the transmitter side experiences increased complexity to the oversampling subprocesses. In contrast, no such complexity is required on the receiver side. That is, implementation costs at the receiver side will be minimal. However, the asymmetry of conventional HFC networks nevertheless allows implementation costs on the transmitter side to be significantly reduced as well. For example, some DOCSIS 3.1 implementations utilize a high-split scenario, such as 1.2 GHz downstream/200 MHz upstream. Accordingly, the costs of transmitting upstream will still be reduced in comparison with costs of transmitting downstream, since the upstream bandwidth is a fraction of the downstream bandwidth. Furthermore, since many end users do not fully utilize the available upstream transport, the sampling needs from a customer perspective might be even lower in practice, and therefore the resulting transmitter implementation costs on the customer side as well.

Additionally, the digital optical link of the upgraded node, according to the embodiments illustrated in FIGS. 4A-B, achieve significantly improved reliability as compared to conventional techniques that are intended to support higher DOCSIS performance levels. That is, the delta-sigma modulation/demodulation techniques of the present embodiments will have superior reliability over conventional remote-CMTS, remote-PHY, and A/D-D/A digitization approaches. The delta-sigma modulation and demodulation processes described herein therefore have particular applicability to support heterogeneous service environments that include wireless backhaul and business connections according to end user requirements, while greatly simplifying the operational complexity for all end users.

Figures 5A, 5B:
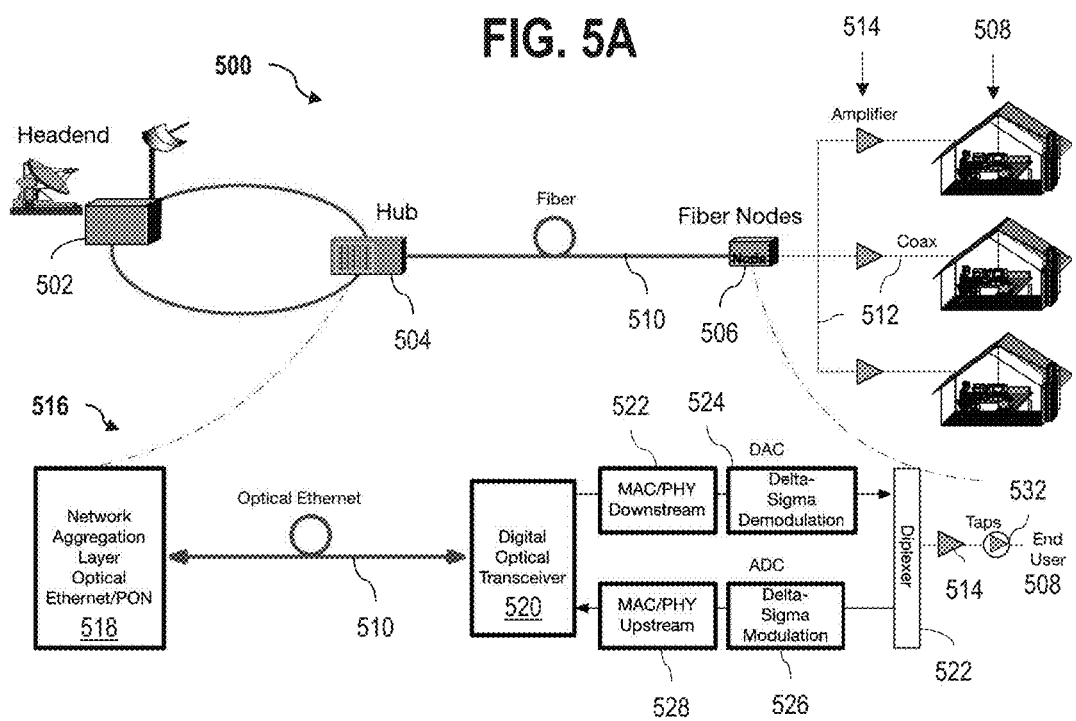
FIGS. 5A-B are schematic illustrations of an exemplary digitized distributed network utilizing the delta-sigma modulation process depicted in FIG. 2B, and the delta-sigma demodulation process depicted in FIG. 3.

FIGS. 5A-B are schematic illustrations of an exemplary digitized distributed network 500 utilizing modulation process 202, FIG. 2B, and demodulation process 300, FIG. 3. As shown in FIG. 5A, distributed network 500 is structurally similar to digitized HFC network 400, and includes a headend 502, a hub 504, a fiber node 506, end users/subscribers 508, at least one optical fiber 510, a plurality of coaxial cables 512, and optional amplifiers 514. Distributed network 500 differs though, from digitized HFC network 400 in operation, as explained further below with respect to FIG. 5B.

FIG. 5B illustrates an exemplary distributed architecture 516 for implementing the delta-sigma modulation and demodulation processes of distributed network 500. Operation of distributed architecture 516 differs from the operation of architecture 420, FIG. 4, in that distributed architecture 516 distributes the PHY layer into the HFC network. That is, distributed architecture 516 distributes the PHY layer to fiber node 506 (or the PHY shelf), thereby effectively removing the PHY from a CMTS 518 (i.e., the CCAP Core), for example, thereby further rendering it possible to eliminate the need for an analog laser (not shown) in the headend 502/hub 504. In this embodiment, CMTS 518 is thus functionally converted to digital fiber Ethernet link (e.g., a network aggregation layer for an optical Ethernet or passive optical network (PON)), and optical fiber 510 functionally serves as an optical Ethernet digital fiber.

At fiber node 506, a digital optical transceiver 520 receives the digital signals from CMTS 518, at a downstream distributed MAC/PHY layer 522 for conversion, by a downstream delta-sigma demodulator 524, to an analog signal. Similarly, an upstream delta-sigma modulator converts analog signals from end users 508 into digitize signals for an upstream distributed MAC/PHY layer 528 to provide to digital optical transceiver 520 for upstream transport over fiber 510. Similar to architecture 420, FIG. 4, distributed architecture 516 may further include a diplexer 530 and at least one tap 532. In this example, distributed architecture 516 advantageously utilizes downstream delta-sigma demodulator 524 as a D/A converter, and upstream delta-sigma modulator 526 as an A/D converter. Therefore, the delta-sigma modulation and demodulation techniques of FIGS. 5A-B may be fully implemented in both the upstream and downstream directions, respectively.

According to this embodiment, a low-cost demodulation process is provided. The implementation thereof achieves an ultra-high resolution for RF signal conversion, and is capable of utilizing either direct or coherent detection technologies using the optical connection between the headend/hub and fiber node. Through the economic simplification of distributed architecture 516, distributed network 500 requires only one delta-sigma modulator/demodulator pair at fiber node 506 for RF-to-digital conversion.

Figures 6A, 6B:
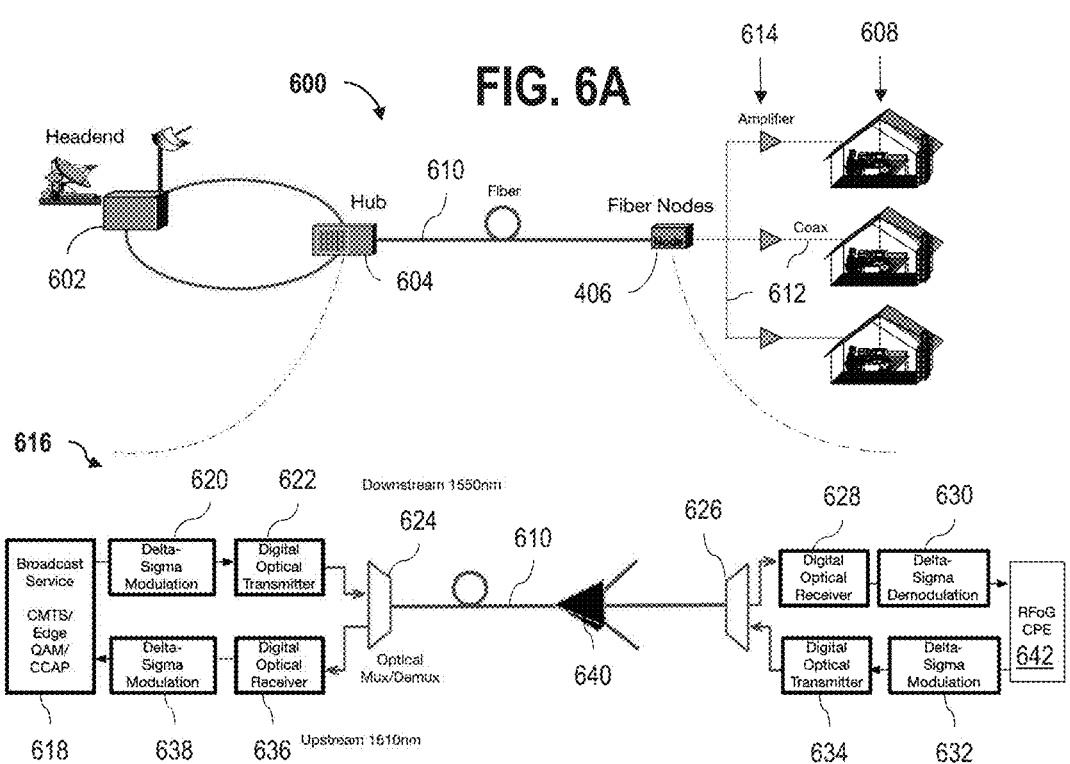
FIGS. 6A-B are schematic illustrations of an exemplary radio frequency over glass network utilizing the delta-sigma modulation process depicted in FIG. 2B, and the delta-sigma demodulation process depicted in FIG. 3.

FIGS. 6A-B are schematic illustrations of an exemplary radio frequency over glass (RFoG) network 600 utilizing modulation process 202, FIG. 2B, and demodulation process 300, FIG. 3. As shown in FIG. 6A, RFoG network 600 is structurally similar to digitized HFC network 400, and includes a headend 602, a hub 604, a fiber node 606, end users/subscribers 608, at least one optical fiber 610, a plurality of coaxial cables 612, and optional amplifiers 614. RFoG network 600 differs though, from digitized HFC network 400, in that RFoG analog optics technology transmits RF over fiber, instead of coaxial cable, to a terminating unit (e.g., an optical network unit (ONU) or an optical network terminal (ONT), not individually shown) deployed at the respective customer premises of end users 608.

FIG. 6B illustrates an exemplary RFoG architecture 616 for implementing the delta-sigma modulation and demodulation processes of RFoG network 600. RFoG architecture 616 is similar to architecture 420, FIG. 4, and includes a CMTS 618, a downstream delta-sigma modulator 620, a downstream digital optical transmitter 622, a hub diplexer 624 (or multiplexer/demultiplexer), a fiber node diplexer 626 (or multiplexer/demultiplexer), a downstream digital optical receiver 628, a downstream delta-sigma demodulator 630, an upstream delta-sigma modulator 632, an upstream digital optical transmitter 634, an upstream digital optical receiver 636 of hub 604, and an upstream delta-sigma demodulator 638. In the exemplary embodiment, RFoG architecture 616 further includes at least one optical splitter 640 disposed along optical fiber 610. Downstream delta-sigma demodulator 630 and upstream delta-sigma modulator 632 communicate with a customer premises equipment (CPE) 642 of at least one end user 608.

According to the advantageous embodiments illustrated in FIGS. 6A-B, a significant improvement to the transmission performance of the digital link of RFoG network 600 is achieved by introducing delta-sigma modulation and demodulation processes at both the headend/hub and the customer premises/end users, thereby effectively replacing optical connection with digital transmissions. The architecture and operation of RFoG network 600 is particularly advantageous to customer users having existing home coaxial wiring and/or CPEs; implementation of RFoG network 600 requires no hardware changes to such existing infrastructure. Furthermore, the digital fiber deep architecture of RFoG network 600 further allows the delivered data rate to be increased to end users 608. Where splitter 640 is implemented, the splitting ratio may also be further increased due to the higher power budget margin achievable from such digital transmission links.

According to the advantageous systems and methods described above, efficient digitization techniques may be employed over conventional HFC in RFoG networks to significantly expand transport capabilities of existing fiber strands, and without requiring significant hardware modification or costs. The systems and methods described herein utilize existing fiber infrastructures to increase the capacity of such existing infrastructures, but without increasing complexity at the receiver side. The present embodiments also advantageously utilize existing network transmission asymmetry to further reduce complexity at the transmitter side. The present systems and methods thus significantly extend the life of existing fiber infrastructures, and also more efficiently use existing optical wavelengths. Through the techniques described herein, a fiber communication network will realize increased scalability, thereby allowing the network to flexibly grow according to increasing demand from cable subscribers.

Exemplary embodiments of analog digitization systems and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other access networks utilizing fiber and coaxial transmission. That is, the delta-sigma modulation techniques herein are described with respect to digitization interfaces for centralized HFC networks, distributed HFC networks, and RFoG networks, but the person of ordinary skill in the art, after reading and comprehending the present description and accompanying drawings, will appreciate that the present embodiments may be further applied to other network applications.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Although specific features of various embodiments of the disclosure may be shown in some drawings and not in others, this is for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A transmitting signal processor in operable communication with a first end of a digital transport medium, comprising:
    an input portion configured to receive a digitized radio frequency (RF) signal including quantization noise over an expanded Nyquist zone of a frequency spectrum corresponding to the digitized RF signal;
    a noise shaper configured to implement a noise transfer function (NTF) to shape the quantization noise out of a low-frequency end of the corresponding frequency spectrum to generate a shaped signal such that the received digitized RF signal and the shaped quantization noise are substantially separated in the frequency domain, wherein the NTF is configured to correspond with a filter function of a receiving processor disposed at a second end of the digital transport medium opposing the first end; and
    a quantizer configured to apply delta-sigma modulation to the shaped signal using at least one quantization bit, and output to the digital transport medium a digitized bit stream that substantially follows the amplitude of the received digitized RF signal.

2. The transmitting processor of claim 1, wherein the received digitized RF signal is a data over cable service interface specification (DOCSIS) RF signal.

3. The transmitting processor of claim 1, wherein the delta-sigma modulation uses a one-bit quantization.

4. The transmitting processor of claim 3, wherein the output digitized bit stream comprises a binary signal.

5. The transmitting processor of claim 1, wherein the delta-sigma modulation uses a two-bit quantization.

6. The transmitting processor of claim 5, wherein the output digitized bit stream comprises a PAM4 signal.

7. The transmitting processor of claim 1, further comprising (i) a transmitter filter configured to filter a time domain analog signal in the frequency domain to produce a filtered frequency domain signal, and (ii) a sampler configured to sample the filtered frequency domain signal at a frequency substantially higher than the low-frequency end to provide the digitized RF signal to the input portion.

* * * * *